United States Patent
Kobayashi et al.

(10) Patent No.: US 7,954,228 B2
(45) Date of Patent: Jun. 7, 2011

(54) RFID TAG MANUFACTURING METHOD WITH STRAP AND SUBSTRATE

(75) Inventors: Hiroshi Kobayashi, Kawasaki (JP);
Naoki Ishikawa, Kawasaki (JP);
Takayoshi Matsumura, Kawasaki (JP);
Shunji Baba, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 1138 days.

(21) Appl. No.: 11/702,168

(22) Filed: Feb. 5, 2007

(65) Prior Publication Data

US 2007/0193021 A1    Aug. 23, 2007

(30) Foreign Application Priority Data

Feb. 10, 2006   (JP) .............................. 2006-034026
Mar. 17, 2006   (JP) .............................. 2006-074260
Aug. 24, 2006   (JP) .............................. 2006-227359

(51) Int. Cl.
    *H01Q 13/00*    (2006.01)
(52) U.S. Cl. ............. 29/600; 29/592.1; 29/846; 29/852; 340/572.5; 343/700 MS
(58) Field of Classification Search ................ 29/592.1, 29/593–594, 600, 832, 840, 827; 343/700 MS, 343/876, 872; 235/488, 492; 340/572.1–572.7, 340/540
See application file for complete search history.

(56) References Cited

U.S. PATENT DOCUMENTS

| | | | | |
|---|---|---|---|---|
| 4,783,646 A | * | 11/1988 | Matzuzaki ................. | 340/572.5 |
| 5,566,441 A | * | 10/1996 | Marsh et al. .................... | 29/600 |
| 6,107,920 A | * | 8/2000 | Eberhardt et al. ......... | 340/572.7 |
| 6,329,313 B1 | * | 12/2001 | Fritze et al. .................... | 502/202 |
| 6,940,408 B2 | * | 9/2005 | Ferguson et al. ........... | 340/572.7 |
| 7,363,704 B2 | * | 4/2008 | Kobayashi et al. ............. | 29/832 |
| 7,546,671 B2 | * | 6/2009 | Finn ............................ | 29/592.1 |
| 2004/0125040 A1 | | 7/2004 | Ferguson et al. ............. | 343/895 |
| 2005/0179552 A1 | | 8/2005 | Shoji et al. ................. | 340/572.7 |
| 2005/0282495 A1 | * | 12/2005 | Forster ........................ | 455/41.2 |
| 2006/0010685 A1 | | 1/2006 | Kobayashi et al. ............. | 29/825 |

FOREIGN PATENT DOCUMENTS

| | | |
|---|---|---|
| EP | 1 498 842 A1 | 1/2005 |
| EP | 1 626 364 A2 | 2/2006 |
| JP | 2000-200332 | 7/2000 |
| JP | 2000-311226 | 11/2000 |
| JP | 2001-351082 | 12/2001 |
| JP | 2006-31336 | 2/2006 |
| WO | WO2004/030148 | 4/2004 |

OTHER PUBLICATIONS

Taiwanese Office Action dated Feb. 2, 2010 issued in corresponding Taiwanese application No. 096102071 with English translation.
European Search Report dated Aug. 3, 2007.

* cited by examiner

*Primary Examiner* — Minh Trinh
(74) *Attorney, Agent, or Firm* — Kratz, Quintos & Hanson, LLP (57) ABSTRACT

In a manufacturing method of a thin and small RFID tag, an antenna metal pattern is formed on a substrate, going once around a dielectric plate, and a recess is formed on the substrate to house an IC chip. A strap on which the IC chip is mounted is connected and fastened to the substrate in the position and orientation in which the IC chip is housed in the recess.

4 Claims, 10 Drawing Sheets

RFID TAG MANUFACTURING METHOD WITH STRAP AND SUBSTRATE

BACKGROUND OF THE INVENTION

1. Field of the Invention

The present invention relates to an RFID (Radio_Frequency_IDentification) tag which exchanges information with external devices in a non-contact manner. Incidentally, the "RFID tag" described herein is also known as an "RFID tag inlay" among those skilled in the art, meaning a component laid into the RFID tag. Also, the "RFID tag" is sometimes called a "wireless IC tag." RFID tags also include contactless IC cards.

2. Description of the Related Art

Recently, various types of RFID tag have been proposed to exchange information with external devices typified by reader-writers in a non-contact manner by radio. A configuration in which an antenna pattern for wireless communications and an IC chip are mounted on a base sheet made of plastics or paper has been proposed as a type of RFID tag (see For example, Japanese Patent Laid-Open Nos. 2000-311226, 2000-200332, and 2001-351082). One possible application for RFID tags of this type is to affix them to goods or the like and identify the goods by exchanging information about the goods with external devices.

Figure 1:
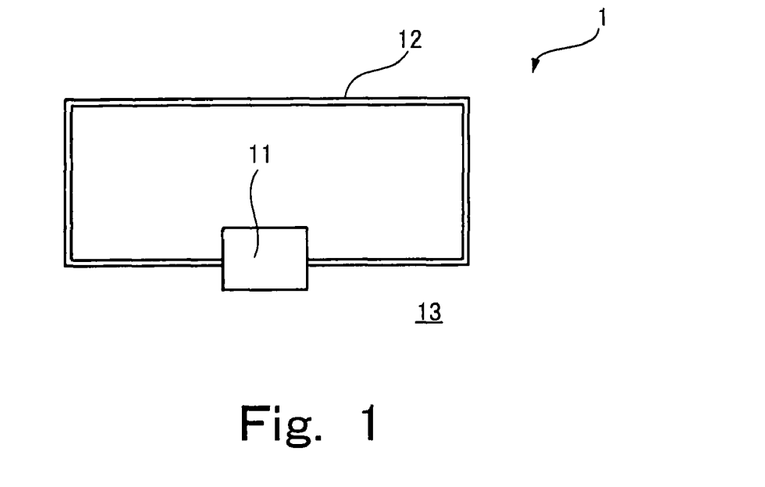
FIG. 1 is a plan view showing an example of a RFID tag.

FIG. 1 is a plan view showing an example of a RFID tag.

The RFID tag 1 shown in FIG. 1 consists of an antenna 12 installed on a sheet-like base 13 made of a PET film or the like and an IC chip 11 electrically connected to the antenna 12 by gold, solder, or the like and bonded to the base 13 with an adhesive.

The IC chip 11 of the RFID tag 1 can exchange information with external devices by conducting wireless communications with them via the antenna 12.

Although in FIG. 1, the antenna 12 of the RFID tag 1 is shown as a loop antenna, the antennas 12 for RFID tags in general are not limited to this shape and an antenna which extends linearly in both directions from an IC chip 11 placed at the center or antennas of various other shapes may be adopted.

RFID tags such as described above may deteriorate greatly in communications performance if there is a metal strip or the like nearby. A RFID tag called a metal tag is known as a means of avoiding such a situation. The metal tag is a RFID tag consisting of a substrate surrounded by a metal pattern which acts as an antenna. Even if a metal strip comes close to it, the metal tag maintains its communications performance except for the part shaded by the metal strip.

Now, a conventional manufacturing method of the metal tag will be described.

Figure 2A:
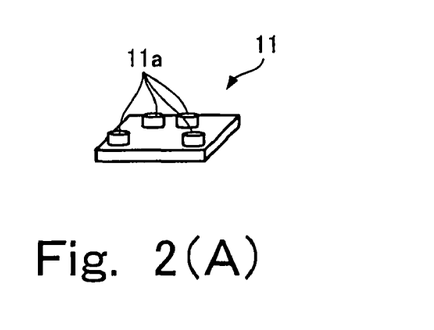
FIGS. 2(A) and 2(B) are perspective views of parts used in the manufacture of a metal tag.
Figure 2B:
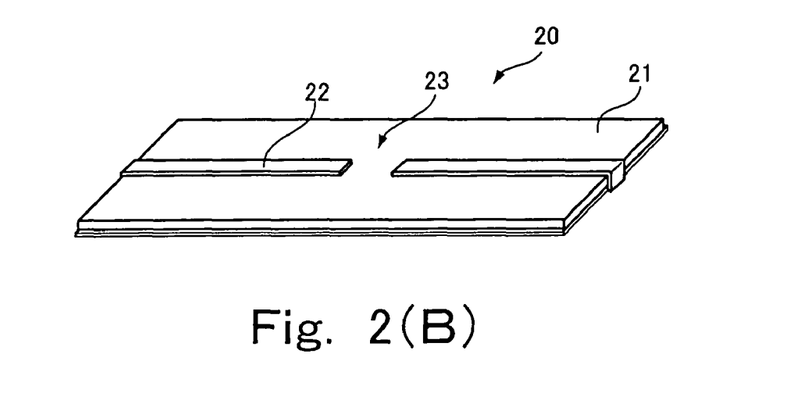

FIGS. 2(A) and 2(B) are perspective views of parts used in the manufacture of the metal tag.

An IC chip 11 (FIG. 2(A)) and a substrate 20 (FIG. 2(B)) for the metal tag are prepared here.

As shown in FIG. 2(A), the IC chip 11 has bumps 11a of gold or the like formed on its connection terminals. In FIG. 2(A), the IC chip 11 is shown upside down from the view of the IC chip 11 in FIG. 1 so that the surface on which the bumps 11a are formed will be visible. The IC chip 11 has capability to exchange information with external devices by conducting wireless communications with them via the antenna (described later) (see FIG. 1).

The substrate 20 consists of a dielectric plate 21 with an antenna metal pattern 22 going around the dielectric plate 21 excluding an area 23 on which the IC chip 11 will be mounted, where the antenna metal pattern 22 will act as an antenna after assembly.

Figure 3A:
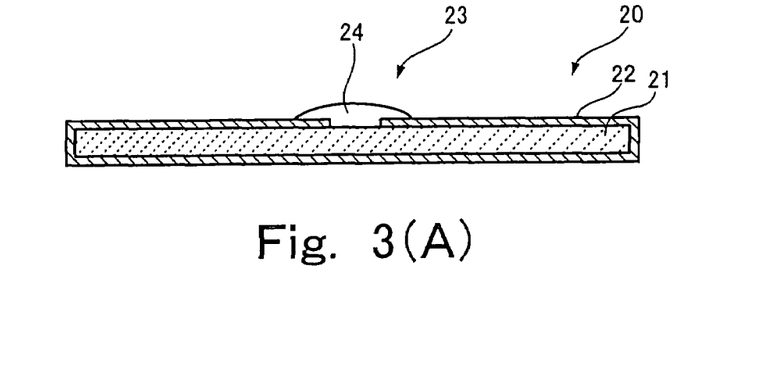
FIGS. 3(A) to 3(C) are diagrams illustrating a process chart showing an example of a manufacturing method for the metal tag.
Figure 3B:
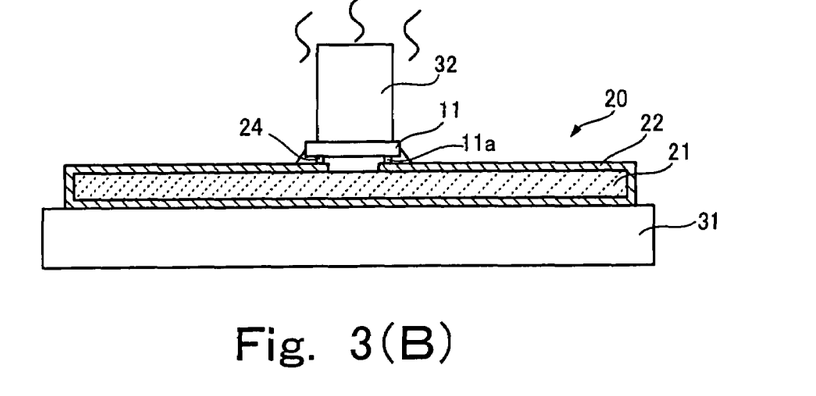
Figure 3C:
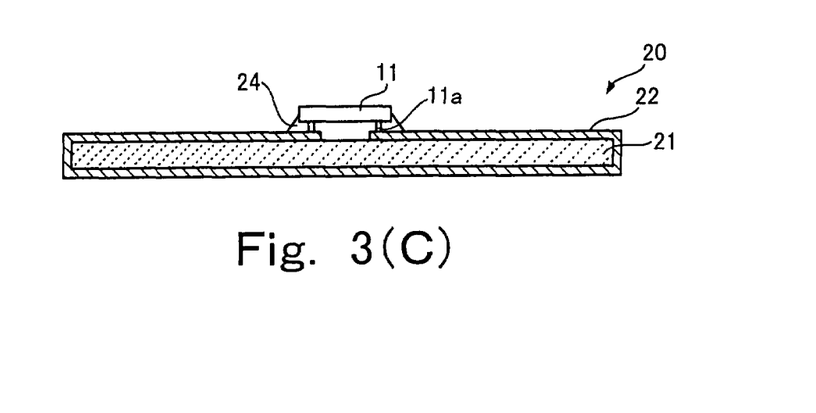

FIGS. 3(A) to 3(C) illustrate a process chart showing an example of a manufacturing method for the metal tag.

Liquid or sheet-like underfill 24 that is a thermosetting adhesive is supplied to that area 23 of the substrate 20 on which the IC chip 11 will be mounted (FIG. 3(A)). The IC chip 11 is placed on the area 23 and then heated and pressurized together with the substrate 20 by being held between a heating stage 31 and a heating head 32. Consequently, the IC chip 11 and antenna metal pattern 22 are electrically connected via the bumps 11a and the IC chip 11 is fastened to the substrate 20 as the underfill 24 hardens (FIG. 3(B)).

Through these processes, the RFID tag with the structure shown in FIG. 3(C) is manufactured.

In the RFID tag, the IC chip 11 conducts wireless communications with external devices via a loop antenna which makes a round, surrounding the front and back surfaces of the dielectric plate 21.

The RFID tag of this type is known as a metal tag. For example, even if a metal strip is brought close to the back side of the substrate 20, the front side on which the IC chip 11 is mounted maintains sufficient communications performance.

However, the RFID tag produced by the manufacturing method described with reference to FIGS. 2(A)-2(B) and 3(A)-3(C) is difficult to make flat and thin because the IC chip 11 mounted on the substrate 20 protrudes from the surface of the substrate 20. To solve this problem, it is at least conceivable to reduce the thickness of the substrate 20. However, in order to obtain desired performance as a loop antenna from the antenna metal pattern 22, it is necessary to provide some distance between those parts of the antenna metal pattern 22 which are located on the front surface and back surface of the substrate. Thus, there is a limit to reducing the thickness of the substrate 20 from the viewpoint of ensuring antenna performance.

SUMMARY OF THE INVENTION

The present invention has been made in view of the above circumstances and provides a manufacturing method of a thin and flat RFID tag which offers the performance of a metal tag as well as the RFID tag produced by the manufacturing method.

A first RFID tag manufacturing method according to the present invention has:

a preparation step of preparing a strap which includes a connector metal pattern formed on a base and a circuit chip mounted on the base, the connector metal pattern being used to connect the circuit chip that conducts wireless communications via an antenna after assembly to an antenna metal pattern that acts as the antenna after assembly, and preparing a substrate which includes the antenna metal pattern formed thereon and a recess formed on a first surface, i.e., one of front and back surfaces of the substrate, to house the circuit chip, and the antenna metal pattern being formed on the substrate such that the antenna metal pattern makes a round excluding the recess by extending from the first surface to a second surface of the front and back surfaces and back to the first surface of the substrate with both ends of the antenna metal pattern located on both sides of the recess; and a connection step of connecting the connector metal pattern on the strap to the antenna metal pattern on the substrate by mounting the strap on the substrate in a position and orientation in which the circuit chip on the strap is housed in the recess formed on the substrate.

With the first RFID tag manufacturing method according to the present invention, the strap is connected by being mounted on the substrate in the position and orientation in which the IC chip is housed in the recess formed on the substrate. Since the IC chip is housed in the recess, it is possible to make the RFID tag thin and flat.

In the first RFID tag manufacturing method according to the present invention, the preparation step may have:

a strap parts preparation step of preparing the circuit chip and a strap sheet with multiple connector metal patterns formed on the base;

a circuit chip mounting step of mounting one circuit chip on each of the multiple connector metal patterns on the strap sheet; and a strap forming step of slicing the strap sheet with the circuit chips mounted into individual straps each having one circuit chip and one connector metal pattern.

In the RFID tag manufacturing method, the circuit chip mounting step may apply a thermosetting adhesive to that part of the strap sheet on which the circuit chips are to be mounted, heat and pressurize the part after mounting the circuit chips on the part, and thereby connect the circuit chips to the connector metal patterns on the strap sheet and fasten the circuit chips to the strap sheet.

The strap parts preparation step, circuit chip mounting step, and strap forming step make it possible to prepare the strap efficiently.

In the RFID tag manufacturing method, the preparation step may include:

a pattern forming step of forming, on a plate member where the recess is formed, a pattern portion of the antenna metal pattern on the first surface and a pattern portion of the antenna metal pattern on the second surface, such that both pattern portions correspond to the recess; and a plating step of plating an edge of the substrate along which a pattern portion that links the pattern portion on the first surface and the pattern portion on the second surface is to run.

Alternatively, in the RFID tag manufacturing method, the preparation step may include:

a pattern forming step of forming, on a plate member where a plurality of the recesses are formed, a first pattern portion of the antenna metal pattern on the first surface and a second pattern portion of the antenna metal pattern on the second surface, such that both pattern portions correspond to each recess;

a piercing step of forming a through hole piercing through the plate member at such a position that corresponds to an edge of the substrate along which a pattern portion that links the first pattern portion and the second pattern portion is to run;

a plating step of plating an inner wall of the through hole, thereby forming the pattern portion that links the first pattern portion and the second pattern portion; and a substrate forming step of dividing the plate member where the antenna metal pattern has been formed into individual substrates.

Employing the pattern forming steps, piercing step, plating steps and substrate forming step makes it possible to efficiently produce the substrate.

Also, in the first RFID tag manufacturing method according to the present invention, the connection step may apply a conductive paste to both ends of the antenna metal pattern on both sides of the recess, heat the strap by mounting the strap on the substrate in the position and orientation in which the circuit chip on the strap is housed in the recess, and thereby connect the connector metal pattern on the strap to both ends of the antenna metal pattern on the substrate.

A first RFID tag according to the present invention has:

a strap that includes a connector metal pattern formed on a base and used to connect a circuit chip which, being mounted on the base, conducts wireless communications via an antenna after assembly to an antenna metal pattern which acts as an antenna after assembly; and a substrate on which a recess is formed on a first surface, i.e., one of front and back surfaces, to house the circuit chip, and the antenna metal pattern is formed making a round excluding the recess by extending from the first surface to a second surface of the front and back surfaces and back to the first surface with both ends of the antenna metal pattern located on both sides of the recess, wherein the connector metal pattern on the strap is connected to the antenna metal pattern on the substrate with the strap mounted on the substrate in a position and orientation in which the circuit chip on the strap is housed in the recess formed on the substrate.

The first RFID tag according to the present invention has a structure in which the IC chip is housed in the recess on the substrate, making the RFID tag thin and flat.

A second RFID tag manufacturing method according to the present invention has:

a preparation step of preparing a tag sheet which includes a metal pattern formed on a base and acting as an antenna, and a circuit chip mounted on the base and conducting wireless communications via the antenna after assembly, and preparing a substrate which includes a recess formed on a first surface, i.e., one of front and back surfaces of the substrate, to house the circuit chip, the substrate being surrounded one turn over the front and back surfaces by the tag sheet, and the substrate having outer surfaces provided with an adhesive which bonds the surrounding tag sheet and conductive material which connects the two ends of the metal pattern on the surrounding tag sheet;

a pressing step of pressing the first surface of the substrate against that position on the tag sheet where the circuit chip is housed in the recess, and thereby affixing the tag sheet to the first surface;

a bending step of bending that part of the tag sheet which sticks out of the substrate, along edges of the substrate; and a re-bending process of bending the tag sheet along the edges so as to fold the tag sheet onto the second of the front and back surfaces of the substrate, affixing the tag sheet to the second surface, and connecting the two ends of the metal pattern by the conductive material.

As with the first manufacturing method, with the second manufacturing method, since the chip is housed in the recess on the substrate, it is possible to make the RFID tag thin and flat.

With the first manufacturing method, since there are two metal patterns, namely, the connector metal pattern and antenna metal pattern, error may occur in antenna length when connecting the two metal patterns with each other as described later with reference to FIG. 11 although on rare occasions. However, with the second manufacturing method, the entire part of the metal pattern which acts as an antenna is formed integrally with the tag sheet, preventing introduction of error in the antenna length during manufacture and thereby making it possible to maintain high communications performance.

Incidentally, the conductive material on the substrate does not cause error in the antenna length.

Figure 12:
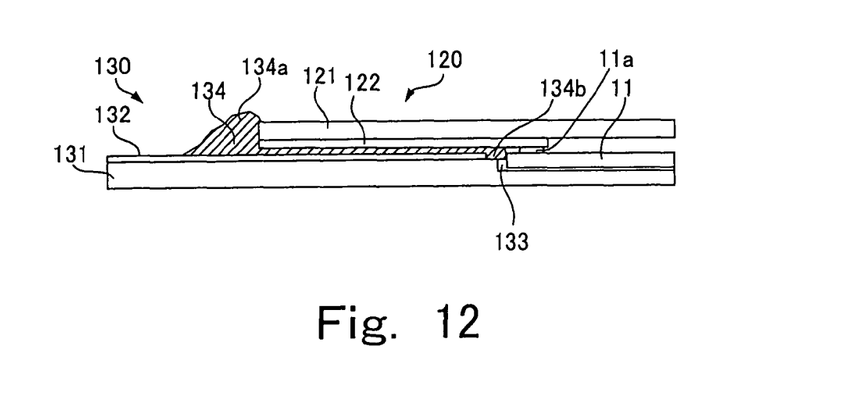
FIG. 12 is a diagram showing another problem encountered on rare occasions with RFID tags produced by the RFID tag manufacturing method shown in FIGS. 4(A) to 9(C)

Also, with the first manufacturing method, a conductive adhesive must be applied in the process of fastening the strap to the substrate and a conductive adhesive in paste form is used after being adjusted to a low level of viscosity for the convenience of application. Consequently, when the strap is pressed against the substrate, the adhesive may form climb-up 134a or squeeze-out 134b as shown in FIG. 12 (FIG. 12 will be described later) although on rare occasions.

On the other hand, the second manufacturing method according to the present invention allows the adhesive to be applied to the entire surface of the substrate in advance, making it possible to use an adhesive with high viscosity and low flowability and eliminating problems described later with reference to FIG. 12.

In this way, the second RFID tag manufacturing method according to the present invention provides a highly reliable RFID tag manufacturing method which can produce thin and flat RFID tags.

In the second RFID tag manufacturing method according to the present invention, the pressing step and bending step may be provided either simultaneously or one after the other in any order.

In the second RFID tag manufacturing method according to the present invention, preferably the bending step bends the tag sheet by fitting the tag sheet in a die.

Also, in the second RFID tag manufacturing method according to the present invention, preferably the bending step bends the tag sheet and presses the tag sheet against the second surface using a roll.

A second RFID tag according to the present invention has:

a substrate with a recess formed on a first surface, i.e., one of front and back surfaces; and a tag sheet including a metal pattern which, being formed on a base, acts as an antenna and a circuit chip which, being mounted on the base, conducts wireless communications via the antenna, where the circuit chip is housed in the recess, the tag sheet is bonded to the substrate by surrounding the front and back surfaces of the substrate one turn, and both ends of the metal pattern are connected to the tag sheet.

As described above, the present invention provides a thin and flat RFID tag.

Furthermore, the second RFID tag manufacturing method according to the present invention provides the second RFID tag which is more reliable than the first RFID tag.

DETAILED DESCRIPTION OF THE INVENTION

Embodiments of the present invention will be described below.

Figure 4A:
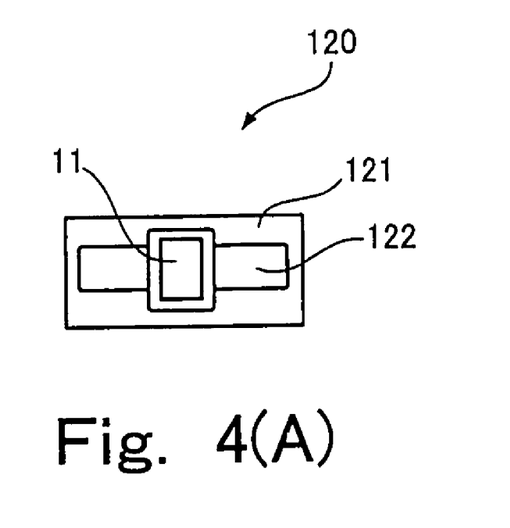
FIGS. 4(A) and 4(B) are perspective views showing parts used in a first RFID tag manufacturing method.
Figure 4B:
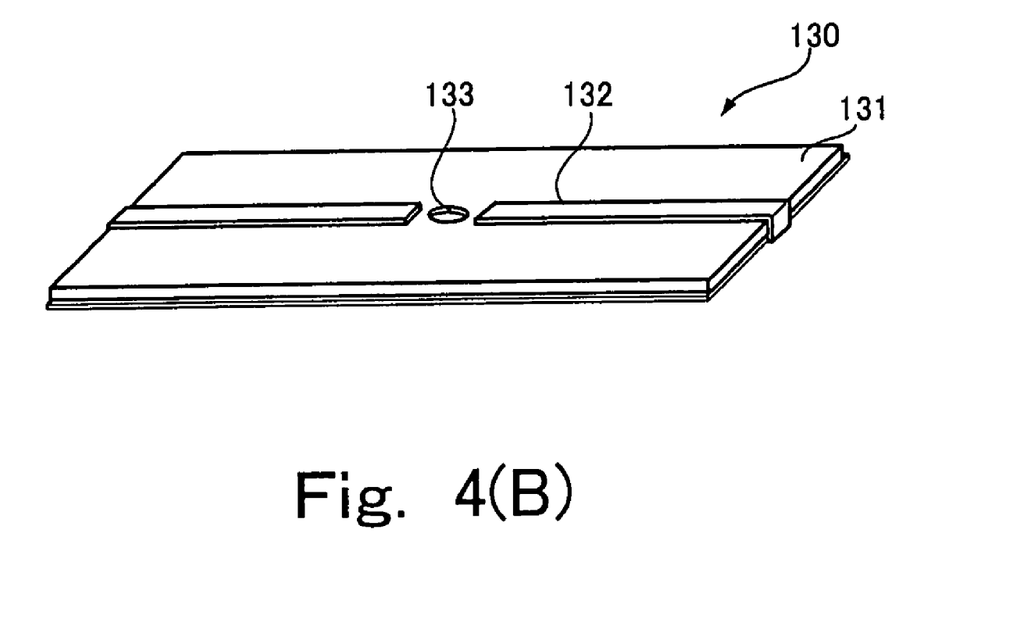

FIGS. 4(A) and 4(B) are perspective views showing parts used in a first RFID tag manufacturing method.

The first manufacturing method prepares a strap 120 shown in FIG. 4(A) and a substrate 130 shown in FIG. 4(B).

The strap 120 shown in FIG. 4(A) includes a connector metal pattern 122 formed on a base 121 made of a PET film or the like and an IC chip 11 mounted on the base 121 and electrically connected with the connector metal pattern 122. As is the case with the IC chip shown in FIG. 2(A), the IC chip 11 has gold bumps formed on it and has capability to conduct wireless communications with external devices via an antenna described later (see FIG. 1).

The substrate 130 in FIG. 4(B) includes a dielectric plate 131 on which a recess 133 is formed to house the IC chip 11 and an antenna metal pattern 132 is formed making a round excluding the recess 133 by going around front and back surfaces.

Next, a manufacturing method of the strap 120 shown in FIG. 4(A) will be described.

Figure 5:
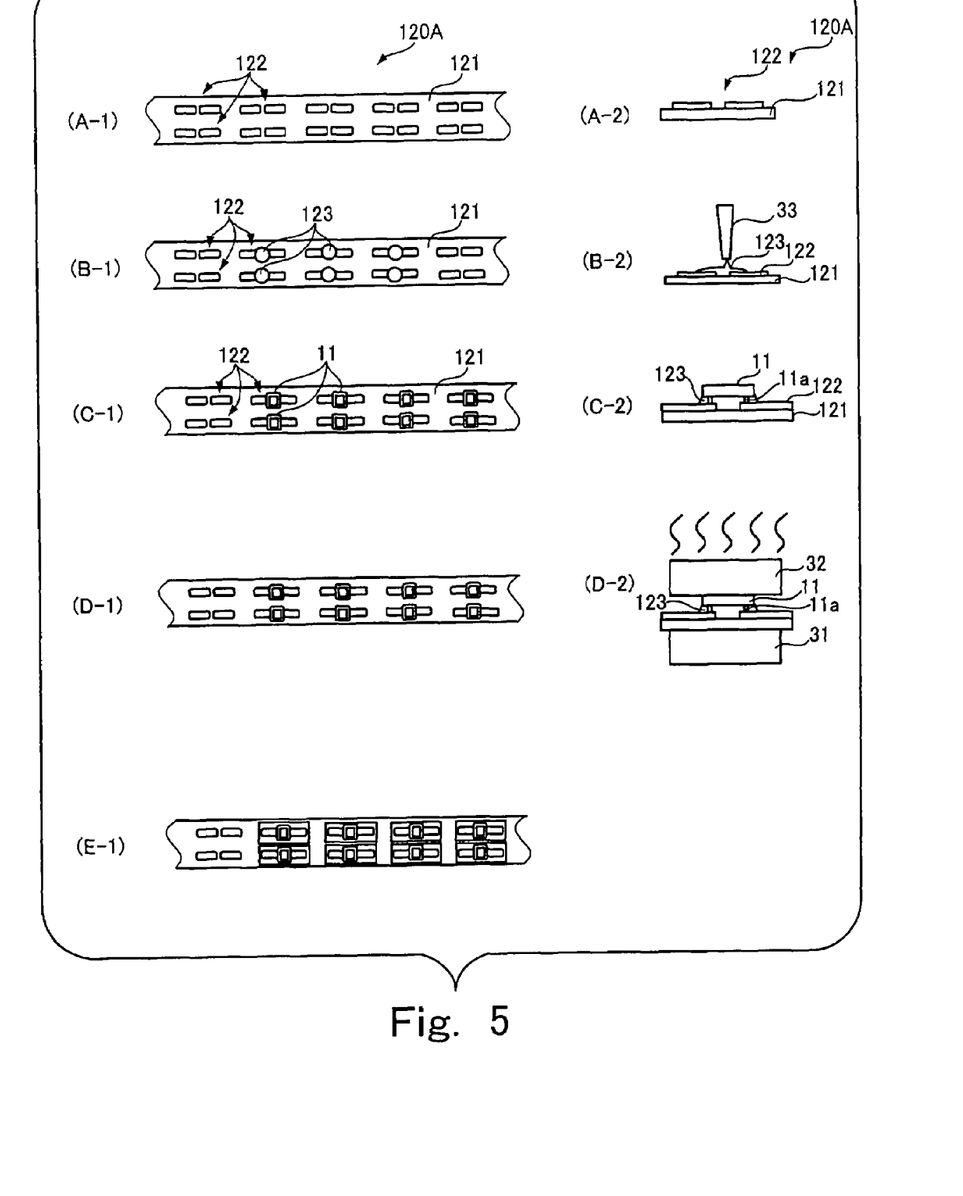
FIG. 5 is a process chart showing a strap manufacturing method.

FIG. 5 is a process chart showing the strap manufacturing method.

First, a long strap sheet 120A is prepared.

As shown in Part (A-1) of FIG. 5, the strap sheet 120A includes multiple connector metal patterns 122 formed on a long base 121 made of a PET film or the like. Part (A-2) of FIG. 5 is a sectional view of one connector metal pattern on the strap sheet 120A.

The connector metal pattern 122 consists of two strips, between which an IC chip is mounted.

Next, liquid or sheet-like underfill 123—which is a thermosetting adhesive—is supplied to the IC chip mounting positions of the connector metal patterns 122 formed on the strap sheet 120A (see Parts (B-1) and (B-2) of FIG. 5). In this case, as shown in Part (B-2) of FIG. 5, liquid underfill 123 is dripped through a nozzle 33.

Next, the IC chips 11 are placed on the underfill 123 (see Parts (C-1) and (C-2) of FIG. 5), and heated and pressurized by being held between the heating stage 31 and heating head 32 (see Parts (D-1) and (D-2) of FIG. 5). Consequently, the IC chips 11 are electrically connected with the connector metal patterns 122 via bumps 11a, and then fastened to the strap sheet 120A as the underfill 123 hardens.

Furthermore, the strap sheet 120A is diced by blanking or cutting into individual straps 120 containing an IC chip 11 and a connector metal pattern 122 (see FIG. 4(A)).

Next, there will be described a manufacturing method of the substrate 130 shown in FIG. 4(B).

The manufacturing method of the substrate 130 is a method of efficiently manufacturing multiple substrates 130 and composed of two or more processes. There will be described below an example that three substrates 130 are manufactured.

Figure 6A:
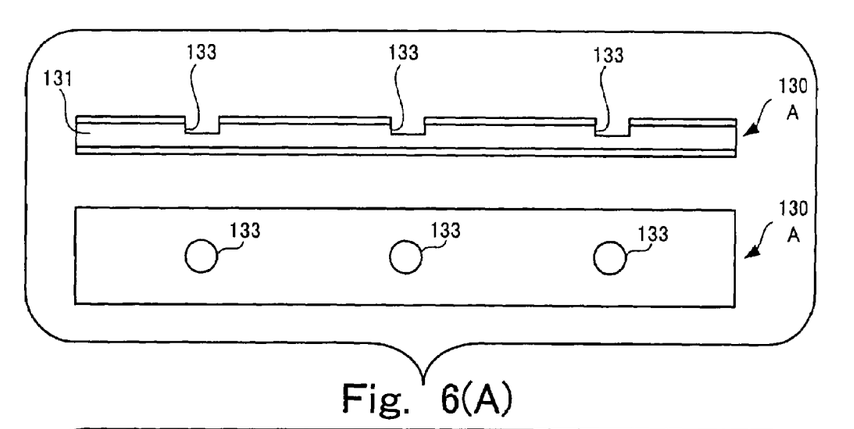
FIGS. 6(A) through 6(C) are diagrams showing a first process in a manufacturing method of a substrate.
Figure 6B:
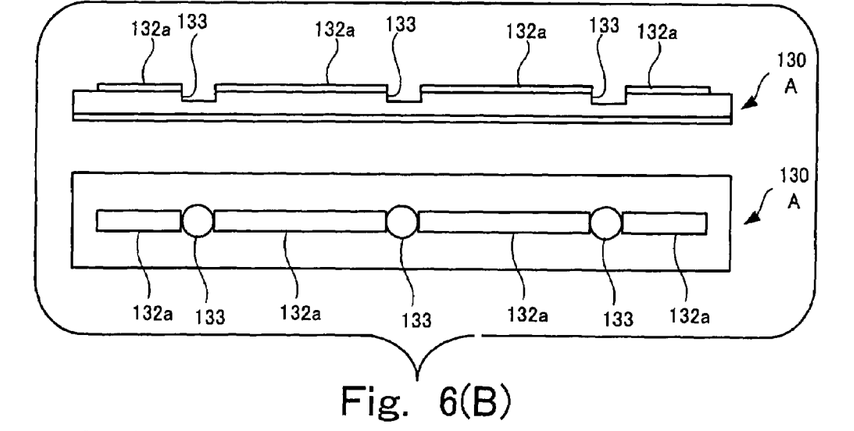
Figure 6C:
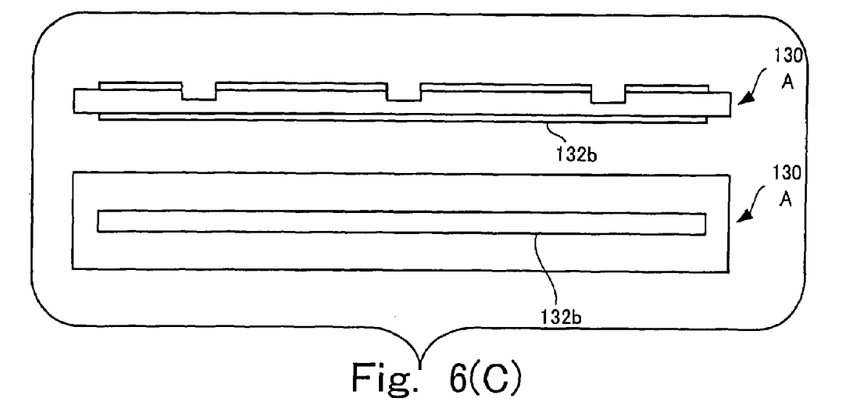

FIGS. 6(A) through 6(C) are diagrams showing a first process in the manufacturing method of the substrate 130.

In this process, there are formed that pattern portions of the antenna metal pattern 132 of the substrate 130 which are to be fixed on the front and back surfaces of the dielectric plate 131, except for pattern portions to run along the both edges of the dielectric plate 131.

First, as shown in FIG. 6(A), the front and back surfaces of the dielectric plate 131 are covered with metal foil for forming a metal pattern. A plate member 130A having three recesses 133 formed on one surface thereof is thus prepared. In the following description, the surface where the three recesses 133 are formed will be referred to as "top surface," while the other surface opposite the top surface will be referred to as "bottom surface."

Subsequently, as illustrated in cross-sectional and top views shown in FIG. 6(B), that parts of the antenna metal pattern 132 shown in FIG. 4(B) which serve as pattern portions 132a extending with the recesses 133 interposed between is formed on the top surface of the plate member 130A for the amount covering three substrates 130. As shown in FIG. 6(B), pattern portions 132a spanning adjacent substrates 130 are each integrally formed as a continuous line. Incidentally, the pattern portions 132a are formed in such a manner that the metallic foil covering the surface of the plate member 130A, except for portions corresponding to the pattern portions 132a, is removed by etching.

Next, as illustrated in cross-sectional and top views shown in FIG. 6(C), that part of the antenna metal pattern 132 shown in FIG. 4(B) which serves as pattern portions 132b for three substrates 130 is formed on the bottom surface of the plate member 130A, opposite the top surface where the recesses 133 are formed. The pattern portions 132b are integrally formed as a continuous line covering the three substrates 130. The pattern portions 132b are also formed by etching.

This first process is efficient because the pattern portions 132a for three substrates 130 are formed on the top surface at a time by the first etching, and the pattern portions 132b for three substrates 130 are formed on the bottom surface at a time by the second etching.

Upon completion of the formation of the pattern portions, the manufacturing method of the substrate 130 proceeds to the next process.

Figure 7A:
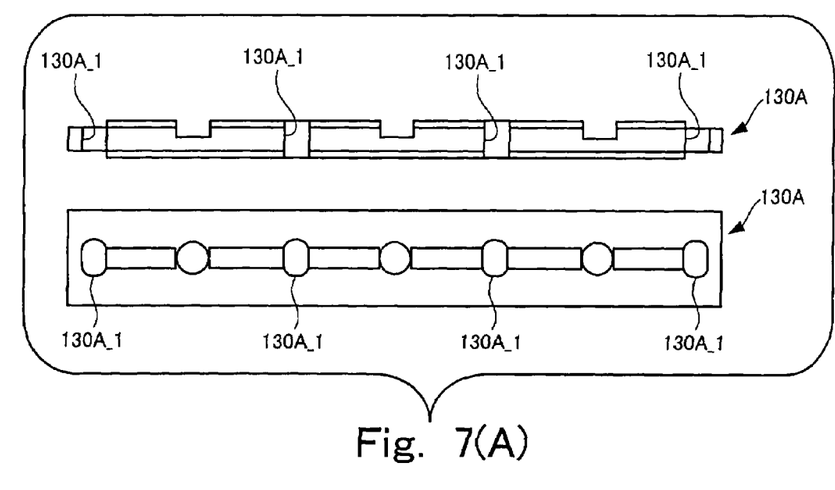
FIGS. 7(A) and 7(B) are diagrams showing a second process and a third process in the manufacturing method of the substrate, respectively.
Figure 7B:
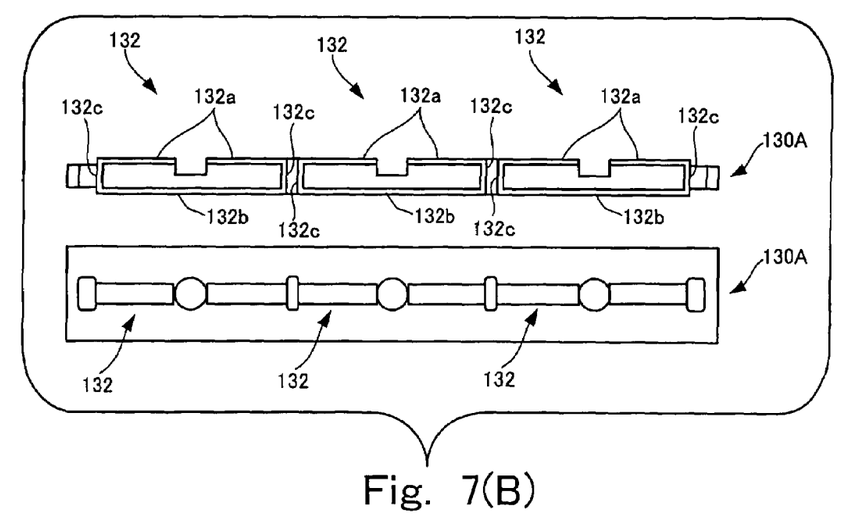

FIGS. 7(A) and 7(B) are diagrams showing a second process and a third process in the manufacturing method of the substrate 130, respectively.

In the second process, as illustrated in cross-sectional and top views shown in FIG. 7(A), a through hole 130A_1 piercing through the plate member 130A is formed at a position that corresponds to each of both edges of the dielectric plate 131 along which the antenna metal pattern 132 is to run in the substrate 130 shown in FIG. 4(B). The hole 130A is formed for each of the three substrates 130.

Subsequently in the third process, as illustrated in cross-sectional and top views shown in FIG. 7(B), an inner wall of each through hole 130A_1 is plated with metal of the same kind as the metal forming each pattern portion. In this way, in the third process, there is formed a pattern portion 132c that runs along each of the edges and links the pattern portion 132a on the top surface and the pattern portion 132b on the bottom surface, so that the antenna metal pattern 132 is completed.

In these second and third processes, plating an inner wall of one through hole 130A_1 forms two pattern portions 132c of the respective adjacent antenna metal patterns 132 at the same time, which is efficient.

After the antenna metal pattern 132 for each of the three substrates 130 is thus formed, each substrate 130 as shown in FIG. 4(B) is completed in the next process.

Figure 8:
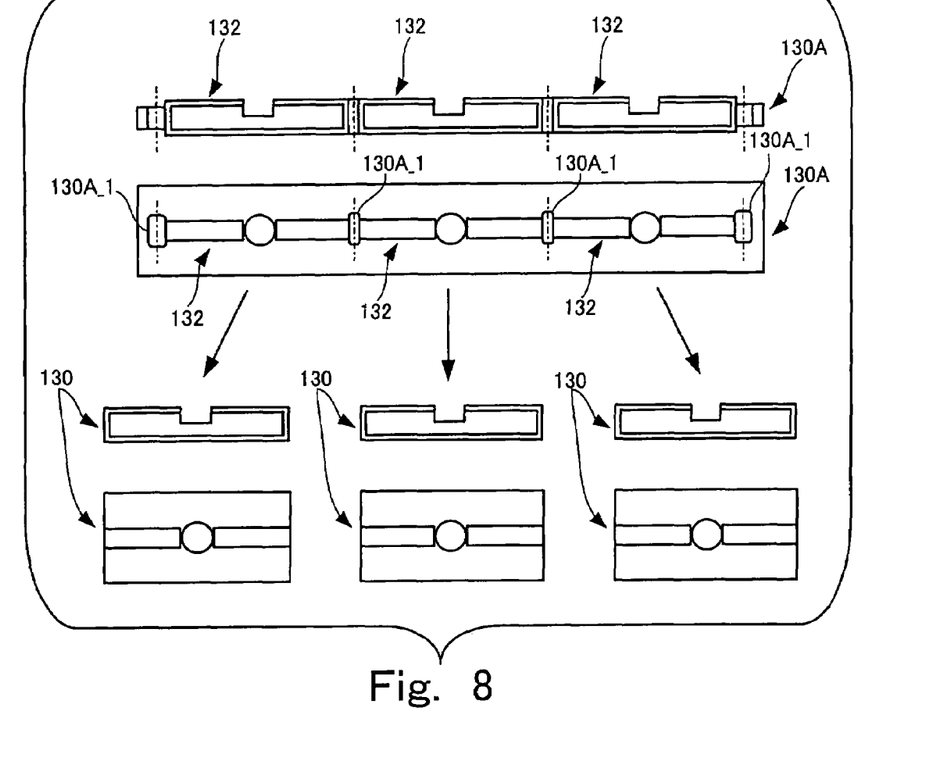
FIG. 8 is a diagram showing a fourth process in the manufacturing method of the substrate.

FIG. 8 is a diagram showing a fourth process in the manufacturing method of the substrate 130.

In the fourth process, as illustrated in cross-sectional and top views shown in FIG. 8, the plate member 130A where the three antenna metal patterns 132 are formed is cut into three pieces along cutting-plane lines passing through the plated through holes 130A_1 and then trimmed. Thus, three substrates 130 as shown in FIG. 4(B) are completed.

Incidentally, there has been described as an example with reference to FIG. 6(A) through FIG. 8, the manufacturing method in which the pattern portion 132a on the top surface and the pattern portion 132b on the bottom surface are formed and then, the through hole 130A_1 is formed and plated. However, the invention is not limited to this example. The manufacturing method of the substrate may be such a method that the through hole 130A_1 is formed and plated first and then, the pattern portion 132a on the top surface and the pattern portion 132b on the bottom surface are formed.

Next, description will be given of a RFID tag manufacturing method which uses the strap 120 thus prepared (shown in FIG. 4(A)) and the substrate 130 thus prepared separately (shown in FIG. 4(B)).

Figure 9A:
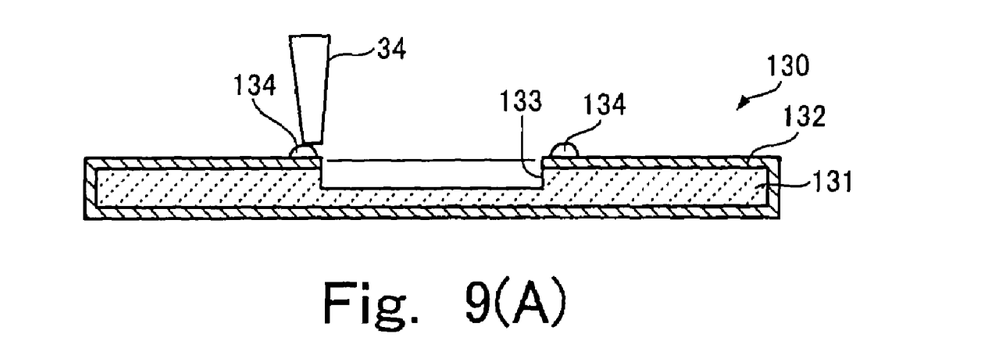
FIGS. 9(A) to 9(C) are diagrams illustrating a process chart showing the RFID tag manufacturing method which uses the strap and substrate shown in FIGS. 4(A) and 4(B)
Figure 9B:
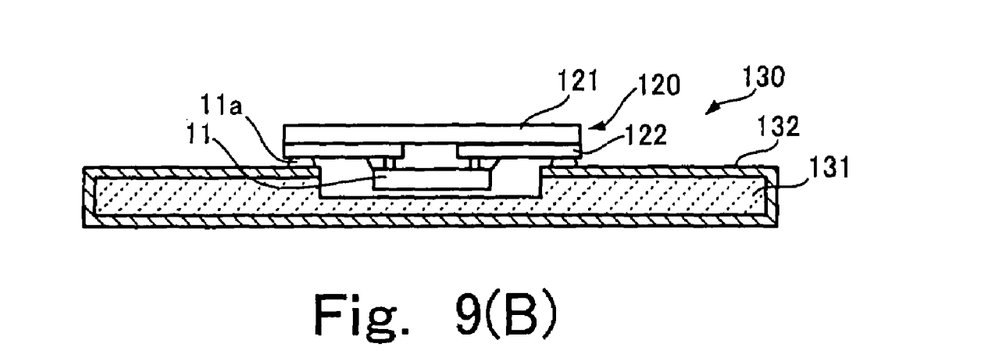
Figure 9C:
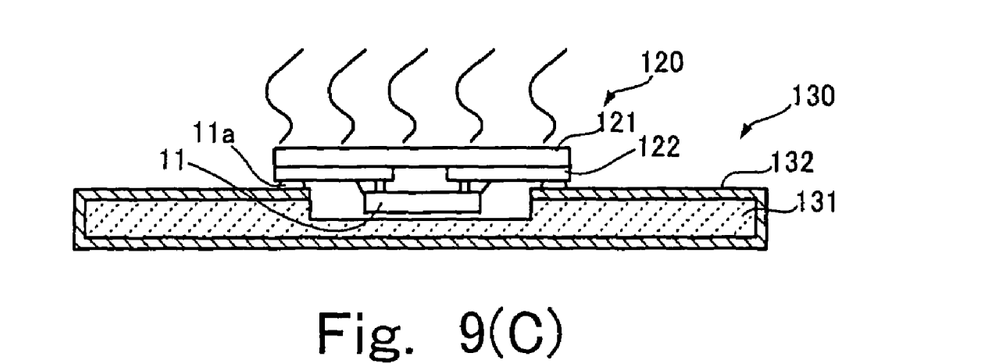

FIGS. 9(A) to 9(C) illustrate a process chart showing the RFID tag manufacturing method which uses the strap 120 and substrate 130 shown in FIGS. 4(A) and 4(B).

First, a thermosetting conductive adhesive 134 is supplied to both ends of the antenna metal pattern 132 on both sides of the recess 133 on the substrate 130 through a dispenser nozzle 34 (FIG. 9(A)). A conductive paste for connection may be printed instead of the supply through the nozzle 34.

Next, the strap 120 is turned upside down and mounted on the substrate 130 with the antenna metal pattern 132 on the substrate 130 aligned with the IC chip 11 on the strap 120 (FIG. 6(B)). As the conductive adhesive is hardened by heating, the connector metal pattern 122 on the strap 120 and the antenna metal pattern 132 on the substrate 130 are electrically connected with each other with the IC chip 11 housed in the recess 133 on the substrate 130 and the strap 120 is fastened to the substrate 130 (FIG. 9(C)).

In the process in FIG. 9(C), in addition to heating, the substrate 130 and strap 120 may be pressurized by being pinched.

In the RFID tag thus manufactured, the connector metal pattern 122 on the strap 120 and the antenna metal pattern 132 on the substrate 130 form a loop antenna which makes a round, surrounding the front and back surfaces of the dielectric plate 131 and via which the IC chip 11 conducts wireless communications with external devices.

Figure 10:
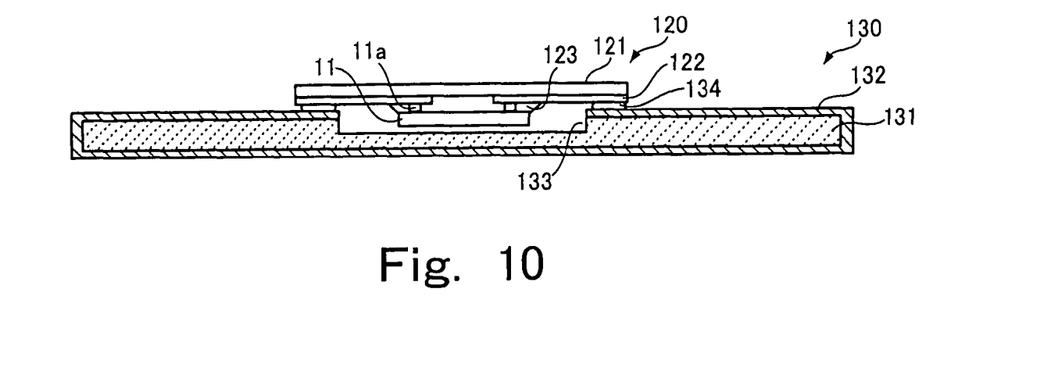
FIG. 10 is a sectional view of a RFID tag produced by the RFID tag manufacturing method shown in FIGS. 9(A) to 9(C)

FIG. 10 is a sectional view of a RFID tag produced by the RFID tag manufacturing method.

The IC chip 11 is housed in the recess 133 on the substrate 130, making the RFID tag thinner and flatter than the conventional example described with reference to FIGS. 2(A)-2(B) and 3(A)-3(C).

Figure 11:
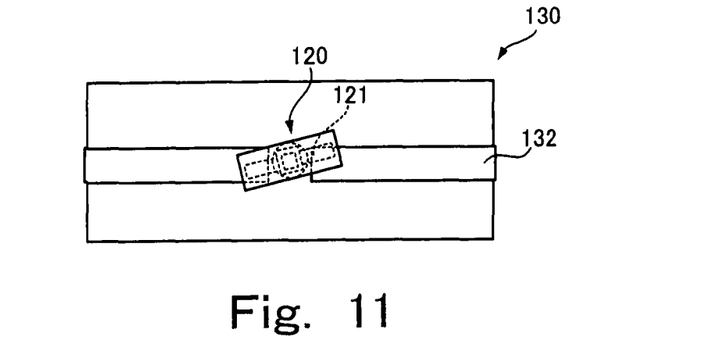
FIG. 11 is a diagram showing one of the problems encountered on rare occasions with RFID tags produced by the RFID tag manufacturing method shown in FIGS. 4(A) to 9(C)

FIG. 11 is a diagram showing one of the problems encountered on rare occasions with RFID tags produced by the RFID tag manufacturing method shown in FIGS. 4(A) to 9(C).

During hardening of the conductive adhesive 134 (see FIG. 6(A)) when or after the strap 120 is mounted on the substrate 130, the strap 120 may tilt on the substrate 130 as shown in FIG. 11. If the strap 120 is mounted in a tilted condition, the loop antenna formed by the connector metal pattern 122 on the strap 120 and the antenna metal pattern 132 on the substrate 130 will deviate from its normal length, which may affect communications functions.

FIG. 12 is a diagram showing another problem encountered on rare occasions with RFID tags produced by the RFID tag manufacturing method shown in FIGS. 4(A) to 9(C).

FIG. 12 is an enlarged view of a bonded portion between the substrate 130 and strap 120.

With the manufacturing method shown in FIGS. 9(A)-9(C), the conductive adhesive 134 in paste form (see FIG. 9(A)) is used when mounting and fastening the strap 120 onto the substrate 130, but it is difficult to accurately control application quantity of the conductive adhesive 134, which is in paste form, in the process shown in FIG. 9(A). A little excess application may cause the conductive adhesive to form climb-up 134a above the strap 120 or squeeze-out 134b inside the recess 133 as shown in FIG. 12. When printing is used by affixing paper to the RFID tag after the process in FIG. 9(A)-9(C), climb-up 134a may cause print defects. Also, squeeze-out 134b inside the recess 133 may cause a short circuit with the IC chip 11, resulting in a malfunction.

RFID tags which encounter any of the problems described with reference to FIGS. 11 and 12 maybe removed in the process of inspection, but it is preferable to increase manufacturing reliability.

Next, description will be given of a RFID tag manufacturing method which can not only produce thin and flat RFID tags, but also increase reliability. Also, description will be given of the RFID tag produced by the manufacturing method.

Figure 13:
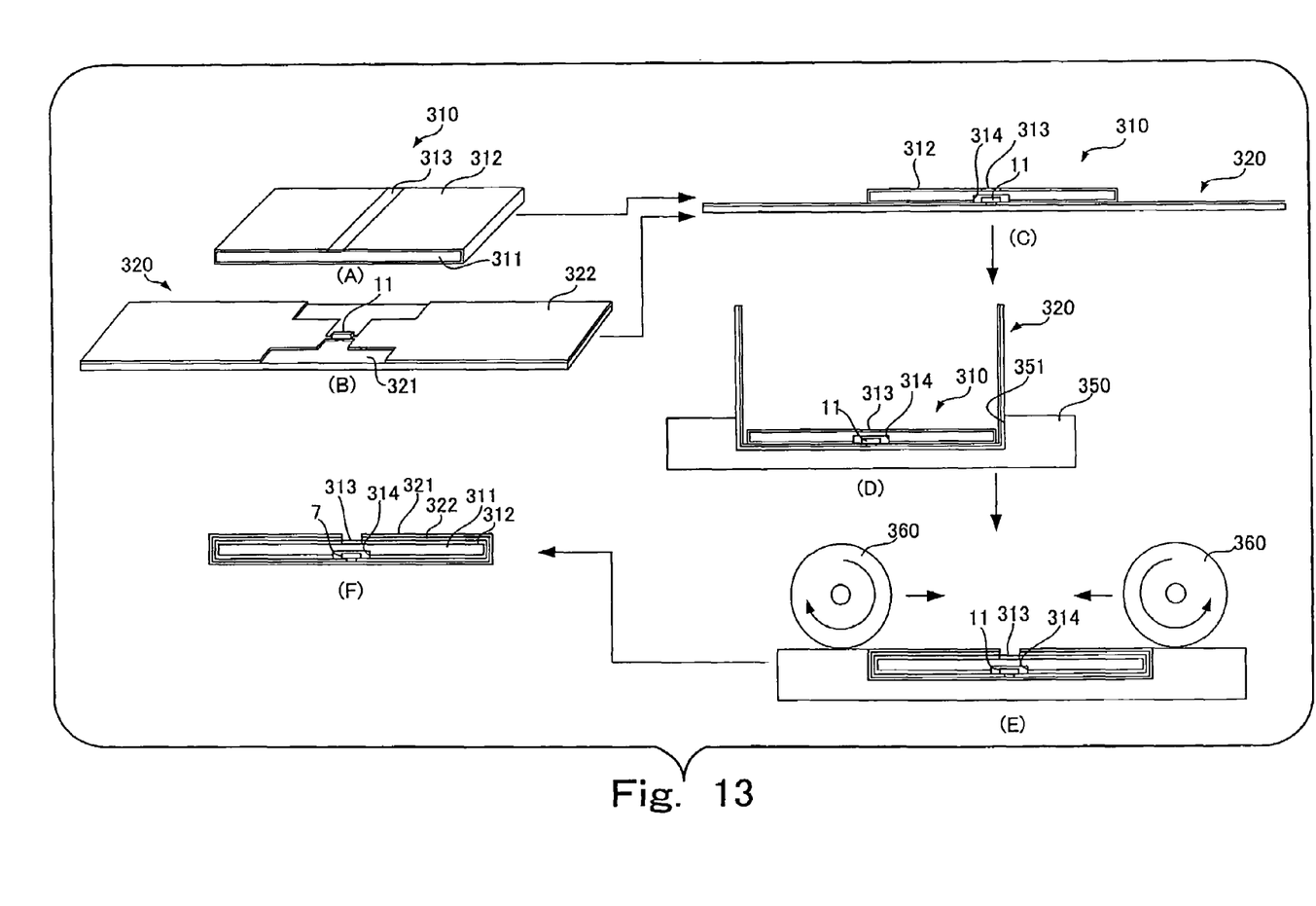
FIG. 13 is a diagram showing an embodiment of a second RFID tag manufacturing method according to the present invention and a RFID tag produced by the second manufacturing method.

FIG. 13 is a diagram showing an embodiment of a second RFID tag manufacturing method according to the present invention and a RFID tag produced by this manufacturing method.

First, a substrate 310 and a tag sheet 320 are prepared (Parts (A) and (B) of FIG. 13).

The substrate 310 consists of a plastic plate 311 with a hole 314 (see Part (C) of FIG. 13) formed to house an IC chip 11. Furthermore, an adhesive 312 is applied to around the substrate 310, and a conductive material 313 such as a conductive sheet or conductive adhesive is applied to a seam of an antenna.

The tag sheet 320 consists of a metal pattern 322 which, being formed on a base 321 made of a PET film or the like, acts as an antenna after manufacture and an IC chip 11 mounted on the base 321 by thermocompression bonding or by solder reflow.

Incidentally, the metal pattern 322 has a design different from that of the metal pattern 132 (see FIG. 4(B)) according to the above embodiment. This is because an optimal pattern is selected according to combination with the IC chip 11, uses, and the like.

Next, a first surface of the substrate 310 on which the recess 314 is formed is pressed against that position on the tag sheet 320 where the IC chip 11 is housed in the recess 314 on the substrate 310, and consequently the tag sheet 320 is affixed to the first surface with the adhesive 312 applied to the substrate 310 (Part (C) of FIG. 13).

The tag sheet 320 with which the first surface of the substrate 310 connected is fitted in a die 350 in which a recess 351 of an appropriate size is formed, and consequently, that part of the tag sheet 320 which sticks out of the substrate 310 is bent along edges of the substrate 310 (Part (D) of FIG. 13).

Instead of the processes in Parts (C) and (D) of FIG. 13, the tag sheet 320 may be fitted alone in the die 350 and bent as shown in Part (D) of FIG. 13, before mounting and bonding the substrate 310 onto it. Alternatively, the tag sheet 320 positioned on the die 350 may be pushed into the recess 351 of the die 350 by the substrate 310 to mount the substrate 310 on the tag sheet 320 and bend the tag sheet 320 simultaneously.

After being processed to the condition shown in Part (D) of FIG. 13, the tag sheet 320 is bent along the edges of the substrate 310 by a roller 360 so as to fold down onto the second surface which is opposite the first surface of the substrate 310 on which the recess 314 is formed, the tag sheet 320 is bonded to the second surface, and both ends of the metal pattern 322 on the tag sheet 320 are connected by the conductive material 313 (Part (E) of FIG. 13).

Through these processes, the RFID tag with the structure shown in Part (F) of FIG. 13 is manufactured.

The manufacturing method shown in FIG. 13 not only produces thin and flat RFID tags as with the embodiment described earlier, but also eliminates the problem of increased antenna length described with reference to FIGS. 11 and 12 as well as further improves reliability.

Also, whereas the manufacturing method described earlier needs the process of blanking or cutting the strap sheet 120A into straps 120, the manufacturing method shown in FIG. 13 eliminates the need for such a process. Also, the manufacturing method shown in FIG. 13 does not need the process of forming a metal pattern on a substrate, which is more complex and costly than the process of applying an adhesive or conductive material on the substrate. In this way, the manufacturing method shown in FIG. 13 requires a smaller number of processes and costs less than the manufacturing method described earlier.

What is claimed is:

1. An RFID tag manufacturing method comprising:
    preparing a strap including a base, a conductive metal pattern formed on the base and a circuit chip mounted on a portion of the conductive metal pattern,
    preparing a substrate including a recess configured to house the circuit chip of the strap therein, and an antenna outside the recess; and
    coupling the conductive metal pattern of the strap to the antenna on the substrate while housing the circuit chip into the recess of the substrate;
    wherein the substrate is prepared by cutting a plate member including a plurality of recesses and antenna patterns into separate ones; and further comprising
    forming a through hole on the antenna pattern extending between adjacent recesses; and
    plating an inner wall of the through hole to form a portion of the antenna pattern.

2. The RFID tag manufacturing method according to claim 1, wherein the strap is prepared by cutting a strap sheet including a plurality of straps into separate ones.

3. The RFID tag manufacturing method according to claim 1, wherein the circuit chip is mounted on the portion of the conductive metal pattern via a thermosetting adhesive.

4. The RFID tag manufacturing method according to claim 1, wherein the conductive metal pattern of the strap is fixed to the antenna pattern on the substrate by curing a conductive paste disposed between the conductive metal pattern and the antenna pattern.

* * * * *